United States Patent [19]

Engelbrecht et al.

[11] Patent Number: 4,530,635

[45] Date of Patent: Jul. 23, 1985

[54] WAFER TRANSFERRING CHUCK ASSEMBLY

[75] Inventors: Orest Engelbrecht, Bethel; Joseph L. Laganza, East Norwalk, both of Conn.

[73] Assignee: The Perkin-Elmer Corporation, Norwalk, Conn.

[21] Appl. No.: 504,718

[22] Filed: Jun. 15, 1983

[51] Int. Cl.³ .............................................. B65H 3/08
[52] U.S. Cl. .................................. 414/627; 294/64.1; 269/21
[58] Field of Search ............... 414/627, 673, 752, 222, 414/225, 589, 590; 294/64 R; 269/21

[56] References Cited

U.S. PATENT DOCUMENTS

| 1,062,579 | 5/1913 | Aylsworth | 294/64 R |
| 3,089,600 | 5/1963 | Fischer, Jr. | 414/627 |
| 3,957,263 | 5/1976 | Christl | 269/21 X |
| 4,006,929 | 2/1977 | Barker | 414/627 X |
| 4,078,671 | 3/1978 | Lundström | 294/64 R X |
| 4,278,348 | 7/1981 | Funk et al. | 269/21 X |
| 4,448,403 | 5/1984 | Riessland et al. | 269/21 |

FOREIGN PATENT DOCUMENTS 138591 12/1978 Japan ................................ 269/21

Primary Examiner—Robert J. Spar
Assistant Examiner—David A. Bucci
Attorney, Agent, or Firm—Thomas P. Murphy; Edwin T. Grimes; Francis L. Masselle

[57] ABSTRACT

A wafer chuck assembly having an elevator for accepting a wafer and placing it precisely on a platen without changing its spatial orientation.

6 Claims, 2 Drawing Figures

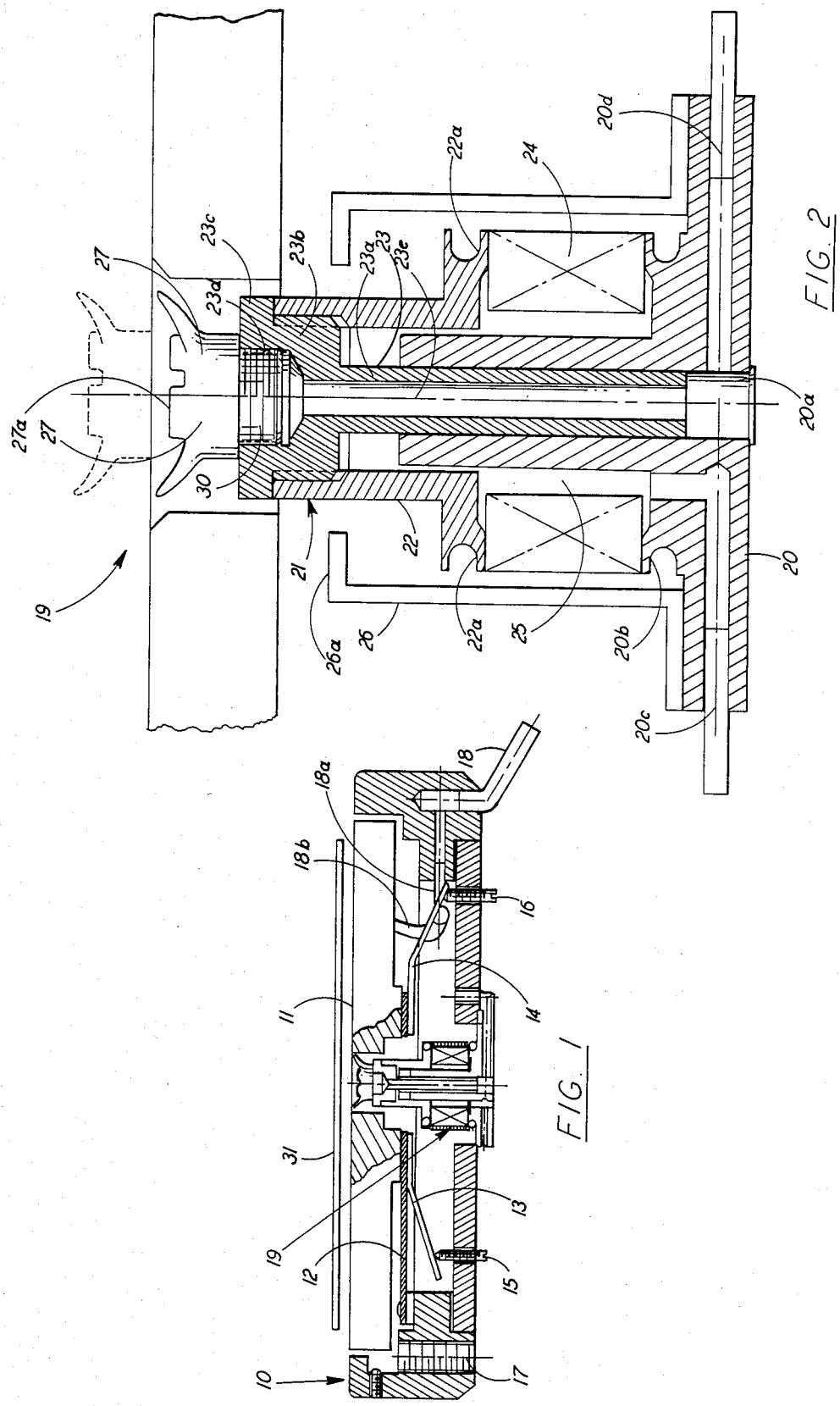

WAFER TRANSFERRING CHUCK ASSEMBLY

BACKGROUND OF THE INVENTION

In the fabrication of integrated circuits the silicon wafers on which circuits are formed must undergo a large number of processing steps. For example, each wafer must be coated, exposed, developed, etched and recoated many times as the integrated circuits on the wafers are built up layer by layer. For many of these processing steps the wafer must first be aligned before being placed at the work station for processing. Thus, in many wafer handling systems the wafer is transported to an alignment station and then after alignment transported to the work station.

After alignment it is most important that the wafer be delivered to the work station without disturbing its previously aligned condition. The present invention relates to a chuck assembly for accomplishing the foregoing.

BRIEF SUMMARY OF THE INVENTION

The present invention relates to a chuck assembly which receives a wafer and precisely places it on a platen without disturbing its spatial orientation.

The chuck assembly of the present invention comprises a platen disposed within a housing. The platen is adapted to receive a wafer which is secured to the platen by means of openings in the surface thereof which communicate with a source of vacuum.

The housing also has disposed therein a wafer lifter mechanism which may be raised to accept a wafer positioned over the platen and lowered to place the wafer onto the platen. The wafer lifter mechanism comprises a base having a cylinder formed therein. Shaft means are disposed in the cylinder. An expanded portion of the shaft means and the base are connected to opposite ends of a metal bellows which together form an airtight volume into which pressurized air may be introduced or exhausted to raise or lower the shaft means. Fixed to one end of the shaft means is a rubber cup to which vacuum may be applied to secure a wafer thereto. The metal bellows and its interconnection within the wafer lifter mechanism function to prevent rotational movement of the shaft means and, therefore, of the wafer when it is lowered to deposit the wafer onto the platen.

BRIEF DESCRIPTION OF THE DRAWINGS

FIG. 1 is a view partly in section of the present invention, and

FIG. 2 is an enlarged view of the wafer lifter mechanism of FIG. 1.

DESCRIPTION

FIG. 1 illustrates the chuck assembly of the present invention. The chuck assembly comprises housing 10 as shown. A platen 11 is disposed within housing and provides a surface for supporting a wafer to be processed. A suspension spring 12 fixed to housing 10 and platen 11 along with preload springs 13 and 14 acting against set screws 15 and 16, respectively, cause the platen 12 to be spring loaded within housing 10. Further means (not shown) may be inserted through opening 17 to maintain platen 11 centrally positioned if tilted or from stressing spring 12 inordinately if the chuck assembly is tilted or turned upside down.

A conduit 18 passes through housing 10 and is connected to platen 11 via conduit 18a and tube 18b to permit vacuum to be connected to platen 11. By means of a manifold and small opening in the surface of the platen 11 wafer 31 may be held fast to the platen 11 by applied vacuum.

A wafer lifter mechanism 19 is centrally located within chuck assembly 10. The wafer lifter mechanism 19 is shown enlarged in FIG. 2.

A wafer lifter mechanism 19 is centrally located within chuck assembly 10.

As shown in FIG. 2 wafer lifter mechanism 19 comprises a base 20 fixed to chuck assembly housing 10 by any convenient means. Base 20 has a cylinder 20a formed therein. Wafer lifter mechanism 19 also comprises a movable element 21. Movable element 21 comprises a cylindrical housing 22 and a piston means 23. Piston means 23 includes a shaft portion 23a slidably disposed in cylinder 20a and a first radially expanded portion 23b disposed in and fixed to the upper portion of cylindrical housing 22, e.g., by threads on the external diameter of portion 23b of piston means 23 and internal threads on the inner diameter of the upper portion of cylindrical housing 22. Piston means 23 has a further expanded portion 23c which abuts the upper end of cylindrical housing 22.

The lower end of cylindrical housing 22 has an extension 22a fixed to one end of a metal bellows 24. The other end of metal bellows 24 is fixed to base 20 at extension 20b. Portion 23a of position means 23, cylindrical housing 22, metal bellows 24 and base 20 forms and airtight seal of the volume 25. Metal bellows 24 is a standard manufactured item available, e.g., from the Metal Bellows Co. of Rhode Island. Metal bellows 24 normally spring biases movable element 21 in the down position as shown. However, when movable element 21 is forced upward as is discussed below, metal bellows 24 expands appropriately in the longitudinal direction while maintaining the airtight character of the volume 25. Metal bellows 24 has the function of maintaining stability of the movable element 21 and particularly prevents rotational movement of the movable element 21 as it is raised and lowered. A limit stop 26 fixed at one end to base 20 has an extension 26a to limit the upward movement of movable element 21 by interaction with extension 22a of cylindrical housing 22.

A relatively solid element 30 is screwed into recess 23d of portion 23c of piston means 23. A flexible rubber cup 27 is attached to solid element 30. Rubber cup 27 and elements 30 and 23 have a common bore which connects to vacuum passage 20d for applying vacuum at the surface of flexible rubber cup 27.

A conduit 20d formed in base 20 communicates with cylinder 20a and the surface of flexible rubber cup 27 via conduit 20d and the ducts in element 26 and flexible rubber cup 27. Thus, when vacuum is applied to conduit 20d, a wafer in contact with flexible rubber cup 27 is sucked down and securely held by the flexible rubber cup 27. Flexible rubber cup 27 may also comprise stops 27a, (e.g., three stops) to prevent overflexure of the flexible rubber cup 27 when it secures a wafer.

When pressurized air is applied to conduit 20c, it enters airtight volume 25 and forces movable elements 22 and 21 upward causing rubber cup 27 to assume the position shown in dashed lines in FIG. 2. In its upward movement rubber cup 27 now with vacuum applied grasps the wafer and lifts it off an input shuttle which has positioned the wafer 31 over the platen. The shuttle is then removed. The wafer is then slowly lowered to platen 11 by the spring action of metal bellows 24 by switching from the positive pressure needed to lift movable element 21 to atmosphere through a restrictor (not shown) in conduit 20 which allows the air to escape slowly. The rate of descent is controlled by the size of the restrictor. Once the piston is retracted to its home position, vacuum is applied to conduit 20c to assure that metal bellows 24 is completely nested. As aforesaid metal bellows 24 function to prevent rotational movement of movable element 21 and thus the previously aligned condition of the wafer is preserved when it is deposited on the platen 11 for processing.

Vacuum is removed from rubber cup 27 and applied to platen 11 thus permitting a work process to be performed on the wafer in any appropriate position since the wafer is fixed to the platen 11 by vacuum.

When processing is finished, vacuum is removed from the platen 11 and the wafer is lifted off the platen by applying pressure to conduit 20c to again force movable element 21 upward with vacuum applied to rubber cup 27 to hold the wafer secure. This permits the wafer to be retrieved by an output shuttle after vacuum is removed from conduit 20. The process is repeated for each wafer arriving at the work station 23.

Other modifications of the present invention are possible in light of the above description which should not be deemed as placing limitations on the invention other than those expressly set forth in the claims which follow:

What is claimed is:

1. A chuck assembly, comprising:
   housing means,
   platen means disposed in said housing,
   base means,
   wafer lifter means centrally disposed in said housing for grasping and depositing a wafer onto said platen means without disturbing its spatial orientation,
   said wafer lifter means comprising:
   base means,
   elevator means movable in the vertical direction relative to said base means,
   metal bellows means connected to said base means and said elevator means normally biasing said elevator means in the down position and preventing rotational movement of said elevator means when it is moved in the vertical direction,
   said base means, elevator means and metal bellows means forming an airtight volume,
   first conduit means formed in said base means communicating with said airtight volume,
   said platen means having a central opening located over said elevator means,
   whereby application of pressurized air to said first conduit means causes said elevator means to be raised through said central opening and withdrawal of said pressurized air source causes said elevator means to be lowered with both movements occurring without rotational movement of said elevator means.

2. A chuck assembly according to claim 1 wherein,
   said elevator means having a shaft at one end,
   said base means having a cylinder formed therein for receiving said shaft.

3. A chuck assembly according to claim 2 wherein said elevator means comprises,
   a flexible cup fixed to the other end of said elevator means,
   second conduit means for applying a vacuum to said flexible cup such that on coming into contact with a wafer said flexible cup secures said wafer by suction.

4. A chuck assembly according to claim 3 wherein said second conduit means comprises,
   one or more orifices extending through said flexible cup and opening in the surface of said flexible cup,
   a conduit in said base means,
   a bore in said shaft communicating with said orifices and said conduit.

5. A chuck assembly according to claim 4 wherein,
   means are provided in said platen means for applying vacuum to the surface thereof to secure a wafer deposited thereon.

6. A chuck assembly according to claim 5 wherein said housing includes,
   flexible means for flexibly restraining the said platen means within said housing.

* * * * *